United States Patent
Snyder (10) Patent No.: US 10,707,345 B2
(45) Date of Patent: Jul. 7, 2020

(54) **LATERALLY DIFFUSED MOSFET WITH LOW RSP*QG PRODUCT**

(71) Applicant: Silanna Asia Pte Ltd, Singapore (SG)

(72) Inventor: David Snyder, Beaverton, OR (US)

(73) Assignee: Silanna Asia Pte Ltd, Singapore (SG)

( * ) Notice: Subject to any disclaimer, the term of this patent is extended or adjusted under 35 U.S.C. 154(b) by 40 days.

(21) Appl. No.: 16/130,150

(22) Filed: Sep. 13, 2018

(65) Prior Publication Data

US 2020/0091340 A1 Mar. 19, 2020

(51) Int. Cl.
  *H01L 29/78* (2006.01)
  *H01L 29/10* (2006.01)
  *H01L 27/06* (2006.01)
  *H01L 29/08* (2006.01)

(52) U.S. Cl.
  CPC ...... *H01L 29/7816* (2013.01); *H01L 27/0617* (2013.01); *H01L 29/086* (2013.01); *H01L 29/0878* (2013.01); *H01L 29/1095* (2013.01)

(58) Field of Classification Search
  CPC ............. H01L 29/7816; H01L 29/0978; H01L 29/1095; H01L 29/086; H01L 27/0617
  See application file for complete search history.

(56) References Cited

U.S. PATENT DOCUMENTS

| | | | |
|---|---|---|---|
| 7,405,443 B1 | 7/2008 | Zuniga et al. | |
| 8,674,440 B2 | 3/2014 | Korec et al. | |
| 8,847,310 B1 | 9/2014 | Korec | |
| 8,928,116 B2 | 1/2015 | Korec et al. | |
| 8,994,105 B2 | 3/2015 | Korec | |
| 8,994,115 B2 | 3/2015 | Korec et al. | |
| 9,412,881 B2 | 8/2016 | Korec et al. | |
| 9,825,124 B2 | 11/2017 | Korec et al. | |
| 2007/0034942 A1 | 2/2007 | Xu et al. | |
| 2007/0034944 A1 | 2/2007 | Xu et al. | |
| 2009/0218622 A1* | 9/2009 | Rijs | H01L 29/0847 257/343 |
| 2009/0242982 A1 | 10/2009 | Cai | |
| 2010/0163979 A1* | 7/2010 | Hebert | H01L 29/4175 257/335 |
| 2011/0241113 A1 | 10/2011 | Zuniga | |
| 2012/0091525 A1 | 4/2012 | Ito | |
| 2012/0273879 A1* | 11/2012 | Mallikarjunaswamy | H01L 29/4175 257/335 |
| 2014/0035047 A1* | 2/2014 | Korec | H01L 27/0629 257/368 |

(Continued)

*Primary Examiner* — Dung A. Le
(74) *Attorney, Agent, or Firm* — MLO, a professional corp.

(57) ABSTRACT

An improved laterally diffused MOSFET (LDMOS) device enables an ability to tune some device parameters independently of other device parameters and/or provides a device architecture with component dimensions that significantly improve device performance. The LDMOS device includes a stepped gate having a first portion with a thin gate insulator over a body region and a second portion with a thick gate insulator over part of a drift region. In some embodiments, a gate shield is disposed over another part of the drift region to reduce a gate-drain capacitance of the LDMOS device. In some embodiments, the LDMOS device has a specific resistance (Rsp) of about 5-8 mOhm*mm$^2$, a gate charge (Qg) of about 1.9-2.0 nC/mm$^2$, and an Rsp*Qg product figure of merit of about 10-15 mOhm*nC.

18 Claims, 4 Drawing Sheets

(56) References Cited

U.S. PATENT DOCUMENTS

| | | |
|---|---|---|
| 2016/0181419 A1 | 6/2016 | Ryu et al. |
| 2017/0229536 A1 | 8/2017 | Stuber et al. |
| 2018/0069077 A1 | 3/2018 | Korec et al. |
| 2019/0259751 A1* | 8/2019 | Pala ............... H01L 27/088 |
| 2019/0371902 A1* | 12/2019 | Castro ............ H01L 29/4236 |

* cited by examiner

LATERALLY DIFFUSED MOSFET WITH LOW RSP*QG PRODUCT

BACKGROUND

Laterally diffused MOSFET (LDMOS) devices are asymmetric power MOSFETs (metal-oxide-semiconductor field-effect transistors) designed for low on-resistance and high blocking voltage. LDMOS devices are commonly used as switching power FETs in power converter integrated circuits, among other applications.

The specific resistance Rsp, the gate charge Qg, the Rsp*Qg product figure of merit (FOM), the source-drain breakdown voltage BVdss, and the safe operating area (SOA) are important device parameters, operation characteristics, or design considerations, among others, that affect the performance, efficiency, and reliability characteristics of LDMOS devices. A lower Rsp*Qg product FOM, for example, generally results in better power conversion efficiency in power converter applications, typically for higher switching frequency applications. Therefore, evolving design requirements for greater power conversion, lower power loss, and/or greater performance efficiency in power converter applications, for example, have led to improvements in LDMOS device design and performance. However, there are various tradeoffs between the device parameters. Such tradeoffs generally limit the ability to simply select, choose, adjust, or tune these parameters for any given design.

SUMMARY

In accordance with some embodiments, an improved laterally diffused MOSFET (LDMOS) device (that enables an ability to tune some device parameters independently of other device parameters and/or that provides a device architecture with component dimensions that significantly improve device performance) includes a source region, a drain region, a body region, a drift region, a stepped gate, a first gate insulator region, a second gate insulator region, and a gate shield. The body region is between the source region and the drain region. The drift region is between the body region and the drain region. The stepped gate has a first portion disposed over the body region and a second portion disposed over a first portion of the drift region. The first and second portions of the stepped gate are continuous with each other. The first gate insulator region is between the first portion of the stepped gate and the body region. The first gate insulator region has a first thickness. The second gate insulator region is between the second portion of the stepped gate and the first portion of the drift region. The second gate insulator region has a second thickness greater than the first thickness. A first portion of the gate shield is disposed over a second portion of the drift region between the stepped gate and the drain region to reduce a gate-drain capacitance of the laterally diffused MOSFET device.

In some embodiments, an improved LDMOS device includes a source region, a drain region, a body region, a drift region, a stepped gate, first and second gate insulator regions. The body region is between the source region and the drain region. The drift region is between the body region and the drain region. The stepped gate has first and second portions adjacent to and continuous with each other. The first gate insulator region is between the first portion of the stepped gate and the body region. The second gate insulator region is between the second portion of the stepped gate and at least a first portion of the drift region. The laterally diffused MOSFET device has a specific resistance (Rsp) of about 5-8 mOhm*mm$^2$, a gate charge (Qg) of about 1.9-2.0 nC/mm$^2$, and an Rsp*Qg product figure of merit of about 10-15 mOhm*nC.

DETAILED DESCRIPTION

Figure 1:
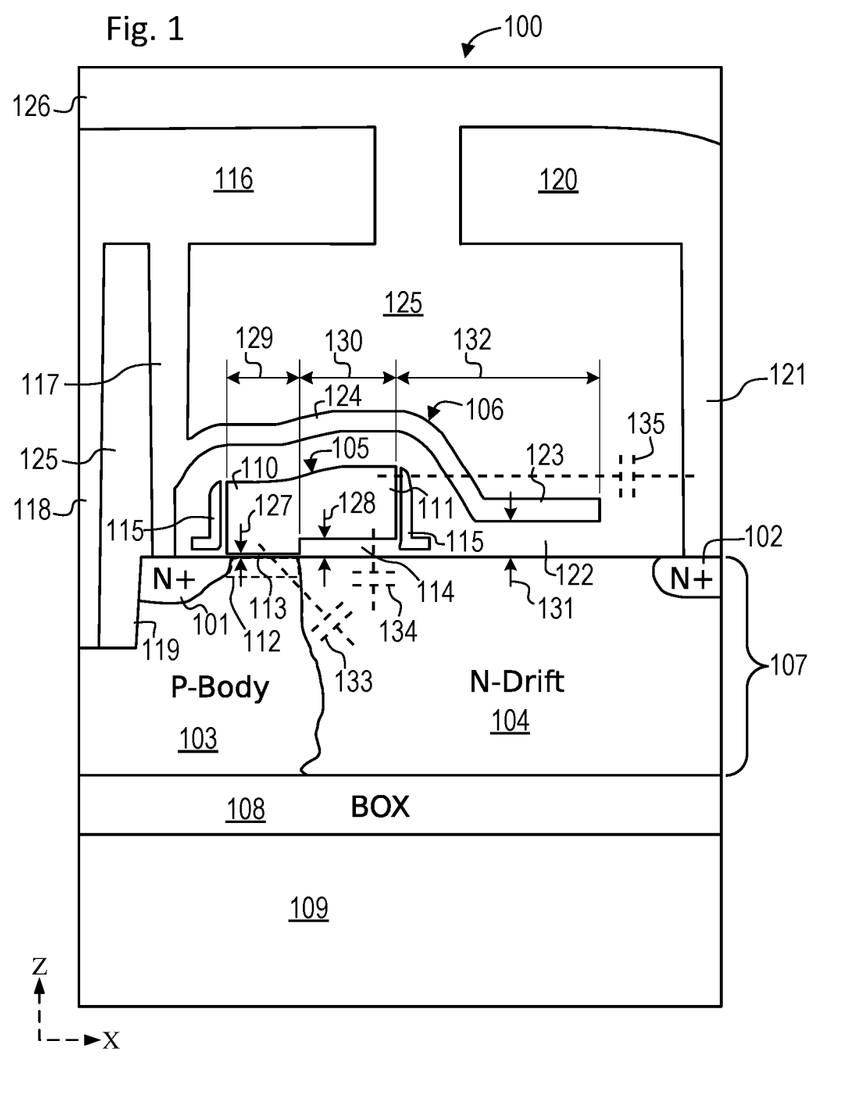
FIG. 1 shows an improved laterally diffused MOSFET (LDMOS) device, in accordance with some embodiments.

A laterally diffused MOSFET (LDMOS) device 100 is shown in FIG. 1, in accordance with some embodiments. As described below, the LDMOS device 100 generally includes a stepped gate architecture, with a gate shield between the stepped gate and a drain, that enables an ability to tune some device parameters independently of other device parameters and/or that enables a device architecture with component dimensions that significantly improve device performance. The dimensions (described below) of the stepped gate lengths and underlying gate oxide thicknesses, for example, generally control the specific resistance Rsp and the gate charge Qg, and thus the Rsp*Qg product figure of merit (FOM). Reducing the specific resistance Rsp and/or the gate charge Qg required for switching the LDMOS device 100 improves (i.e., reduces) the Rsp*Qg product FOM and improves (i.e., increases) the efficiency of the LDMOS device 100. A critical factor in some embodiments, therefore, provides for these dimensions to be smaller than those used in typical LDMOS applications, thereby resulting in lower Rsp, Qg, and Rsp*Qg product FOM than for such typical LDMOS applications. The gate shield, in addition, generally provides for control of the source-drain breakdown voltage BVdss and the safe operating area (SOA) independently of the Rsp and Qg, in some embodiments. In typical LDMOS applications, on the other hand, a design adjustment beneficially affecting one of these parameters (e.g., Rsp) would negatively affect, or require an undesirable adjustment to maintain, one or more of the other parameters (e.g., Qg and/or BVdss). Embodiments of the LDMOS device 100, therefore, provide for the stepped gate and underlying gate oxide to be designed for lower Rsp, lower Qg, lower Rsp*Qg product FOM, higher switching frequencies, and greater operating efficiency; whereas, combinations with the gate shield further provide for such improvements to be joined with greater breakdown voltage, better SOA, and improved reliability of the LDMOS device 100. Therefore, an overall electronic circuit incorporating the LDMOS device 100, such as a power converter circuit, would exhibit lower power loss and greater switching frequency, power conversion efficiency, and performance reliability and could incorporate smaller additional components for an overall smaller footprint or size. Additional advantages or improvements will be described below or will be apparent from the following description.

The LDMOS device 100 generally includes a source region 101, a drain region 102, a body region 103, a drift region 104, a stepped gate 105, and a gate shield 106, among other elements, some of which are not shown or described for simplicity. The illustrated elements of the LDMOS device 100 are not necessarily drawn to scale, such that the relative dimensions of the elements may be different from those depicted in FIG. 1.

The source region 101, the drain region 102, the body region 103, and the drift region 104 generally form an active region or layer 107 of the LDMOS device 100. In some embodiments, e.g., for an NMOS transistor (nLDMOS) device, the drift region 104 is doped with an N-type material (e.g., as an N-drift region), the source region 101 and the drain region 102 are also doped with an N-type material (e.g., more heavily than the drift region 104, i.e., as N+ regions), and the body region 103 is doped with a P-type material (e.g., as a P-body region). In some embodiments for a PMOS transistor (pLDMOS) device, the N and P conductivity designations are reversed.

In some embodiments, the LDMOS device 100 is formed in and on a semiconductor-on-insulator (SOI, e.g., silicon-on-insulator) wafer, in which case a buried insulator (e.g., a buried oxide, or BOX) layer 108 is disposed under the body region 103 and the drift region 104, and a substrate layer 109 is disposed under the buried insulator layer 108. In some embodiments, the underlying substrate layer 109 is also known as a handle wafer or layer, depending on a method of fabrication of the SOI wafer. A semiconductor layer (e.g., an epitaxially grown layer, such as an N− layer) is formed on the buried insulator layer. The active layer 107 (e.g., including the source region 101, the drain region 102, the body region 103, and the drift region 104) is formed in and on the semiconductor layer. In some embodiments, on the other hand, the LDMOS device 100 is formed in and on a bulk semiconductor wafer, in which case the buried insulator layer 108 is not present, and the active layer 107 is formed in and on a top portion of the bulk semiconductor wafer, such as with an N− or a P− substrate.

The stepped gate 105 (e.g., any appropriate conductive material, such as polysilicon, metal, etc.) generally includes a first gate portion 110 and a second gate portion 111. The first gate portion 110 of the stepped gate 105 is disposed over and generally aligned with a channel portion 112 of the body region 103 that is at or near a top surface of the active layer 107. A first gate insulator region (e.g., a gate oxide) 113 is disposed between the first gate portion 110 of the stepped gate 105 and the body region 103. A second gate insulator region (e.g., a gate oxide) 114 is disposed between the second gate portion 111 of the stepped gate 105 and a portion of the drift region 104 that is adjacent to or near the body region 103. Electrically insulating spacers 115 are disposed on opposite lateral sides of the stepped gate 105.

A body/source metal region 116 (e.g., part of a first metal or electrically conductive interconnect layer) electrically connects to the source region 101 and the body region 103 through a source contact 117 and a body contact 118 (e.g., at the bottom of an optional trench 119), respectively. A drain metal region 120 (e.g., part of the first metal or electrically conductive interconnect layer) electrically connects to the drain region 102 through a drain contact 121. An electrical connection from the first metal or electrically conductive interconnect layer through a gate contact to the stepped gate 105 is not shown, because the gate contact is outside the plane of FIG. 1.

A shield insulator region (e.g., a shield oxide) 122 is disposed between the gate shield 106 and the drift region 104 (i.e., under a first shield portion 123 of the gate shield 106) and between the gate shield 106 and the stepped gate 105 (i.e., under a second shield portion 124 of the gate shield 106). The shield insulator region 122 also generally surrounds the stepped gate 105 (and the spacers 115), thereby also electrically insulating the stepped gate 105 from the source contact 117 in some embodiments. An additional insulator region (e.g., an oxide) 125 is disposed over the gate shield 106, below the body/source metal region 116 and the drain metal region 120, and between the source contact 117, the body contact 118, and the drain contact 121.

Additional metal or electrically conductive interconnect layers (not shown) are formed over the body/source metal region 116 and the drain metal region 120 and electrically connected by via interconnects (not shown). Additional insulating layers (e.g., 126) are disposed in between each metal or electrically conductive interconnect layer and surround the via interconnects.

The first gate insulator region 113 has a vertical thickness (indicated by dimension arrows 127 in direction or dimension Z) between the first gate portion 110 of the stepped gate 105 and the body region 103. The second gate insulator region 114 has a vertical thickness (indicated by dimension arrows 128 in the direction or dimension Z) between the second gate portion 111 of the stepped gate 105 and the portion of the drift region 104 that is adjacent to or near the body region 103. The thickness (128) of the second gate insulator region 114 is greater or thicker than the thickness (127) of the first gate insulator region 113. Thus, the first gate insulator region 113 is also known as a thin gate insulator or oxide, the second gate insulator region 114 is also known as a thick gate insulator or oxide, the first gate portion 110 of the stepped gate 105 is also known as a thin gate portion, and the second gate portion 111 of the stepped gate 105 is also known as a thick gate portion. In various embodiments, the dimension value for the thickness (127) of the first gate insulator region 113 is about 20-30 Å, or about 20-60 Å, or about 30-60 Å, or about 30-62 Angstroms (Å), or about 30-125 Å, or about 30-130 Å, or within any appropriate range having a lower limit of about 20-30 Å and an upper limit of about 60-130 Å. In various embodiments, the dimension value for the thickness (128) of the second gate insulator region 114 is about 100-200 Å, or about 100-400 Å, or about 100-700 Å, or about 300-500 Å, or about 400-700 Å, or within any appropriate range having a lower limit of about 100-400 Å and an upper limit of about 400-700 Å. In some embodiments, the dimension values for the thickness (127) of the first gate insulator region 113 and/or the thickness (128) of the second gate insulator region 114 depend on the voltage rating of the overall electronic circuit incorporating the LDMOS device 100 (e.g., a power converter circuit producing 1.8 V, 3.3 V, 5.0V or any other appropriate voltage level).

In some embodiments, the first gate portion 110 of the stepped gate 105 and the first gate insulator region 113 have a length (Lgthin) (indicated by dimension arrow 129) in a lateral direction or dimension X. Additionally, the second gate portion 111 of the stepped gate 105 has a length (Lgthick) (indicated by dimension arrow 130) in the lateral direction or dimension X, i.e., extending over the portion of the drift region 104 that is adjacent to or near the body region 103. In various embodiments, the dimension value for the length Lgthin (129) is about 0.1-0.2 µm, or about 0.1-0.3 µm, or about 0.1-0.4 µm, or about 0.2-0.4 µm, or about 0.3-0.4 µm, or within any appropriate range having a lower limit of about 0.1-0.3 µm and an upper limit of about 0.2-0.4 µm. In various embodiments, the dimension value for the length Lgthick (130) is about 0.1-0.3 µm, or about 0.1-0.4 µm, or about 0.1-0.5 µm, or about 0.1-0.6 µm, or about 0.2-0.6 µm, or about 0.3-0.6 µm, or about 0.4-0.6 µm, or about 0.5-0.6 µm, or within any appropriate range having a lower limit of about 0.1-0.5 µm and an upper limit of about 0.2-0.6 µm. In some embodiments, the dimension values for the length Lgthin (129) and/or the length Lgthick (130) depend on the voltage rating of the overall electronic circuit incorporating the LDMOS device 100 (e.g., a power converter circuit producing 1.8 V, 3.3 V, 5.0V or any other appropriate voltage level).

The shield insulator region 122 has a thickness (indicated by dimension arrows 131) between the first shield portion 123 of the gate shield 106 and a portion of the drift region 104 that is between the stepped gate 105 (or the second gate portion 111 thereof) and the drain region 102. In various embodiments, the dimension value for the shield insulator region thickness (131) is about 700-800 Å, or about 700-900 Å, or about 700-1000 Å, or about 700-1500 Å, or about 900-1100 Å, or about 1000-1200 Å, or about 1000-1500 Å, or about 1200-1500 Å, or within any appropriate range having a lower limit of about 700-1000 Å and an upper limit of about 1000-1500 Å. Additionally, the first shield portion 123 of the gate shield 106 extends a length (indicated by dimension arrow 132) beyond the stepped gate 105 (e.g., from above an edge of the second gate portion 111 thereof) toward the drain region 102 or the drain contact 121. In various embodiments, the dimension value for the first shield portion length (132) is about 0.3-0.4 µm, or about 0.3-0.5 µm, or about 0.3-0.6 µm, or about 0.3-0.7 µm, or about 0.4-0.7 µm, or about 0.5-0.7 µm, or about 0.6-0.7 µm, or within any appropriate range having a lower limit of about 0.3-0.6 µm and an upper limit of about 0.4-0.7 µm. In some embodiments, the dimension values for the shield insulator region thickness (131) and/or the first shield portion length (132) depend on the voltage rating of the overall electronic circuit incorporating the LDMOS device 100 (e.g., a power converter circuit producing 1.8 V, 3.3 V, 5.0 V or any other appropriate voltage level).

Additionally, in some embodiments (as shown), the gate shield 106 is electrically connected directly to the source contact 117 to bias the gate shield 106 or receive electrical power. In other embodiments, the gate shield 106 is not electrically connected directly to the source contact 117, but receives electrical power independently from that of the source region 101 and the source contact 117, so that the electric field generated thereby can be controlled independently.

The length Lgthin (129) of the first gate portion 110, the length Lgthick (130) of the second gate portion 111, the thickness (127) of the first gate insulator region 113, and the thickness (128) of the second gate insulator region 114, among other parameters, affect the specific resistance Rsp and the gate charge Qg. Changing these parameters, therefore, allows for tailoring the specific resistance Rsp and the gate charge Qg to the design requirements of a given application of the LDMOS device 100. For example, shorter (or longer) lengths Lgthin (129) and Lgthick (130) generally correspond to smaller (or larger, respectively) gate charge Qg. Thinner (or thicker) gate insulator thicknesses (127) and (128) generally correspond to a larger (or smaller, respectively) gate charge Qg. Longer (or shorter) lengths Lgthin (129) and Lgthick (130) generally correspond to a smaller (or larger, respectively) specific resistance Rsp. Thinner (or thicker) gate insulator thicknesses (127) and (128) generally correspond to a smaller (or larger, respectively) specific resistance Rsp.

In some embodiments, the first gate portion 110 and the channel portion 112 of the body region 103 are aligned at their edges and have the same length Lgthin (129) from about the junction of the source region 101 and body region 103 to about the junction of the body region 103 and the drift region 104. (The length Lgthick (130), therefore, extends from about the junction of the body region 103 and the drift region 104 toward the drain region 102.) This alignment of the first gate portion 110 and the channel portion 112 can be achieved by forming the first gate portion 110 and the body region 103 in a series of process steps for a self-alignment procedure that ensures that the left and right edges (as shown) of the first gate portion 110 and of the channel portion 112 are properly substantially aligned (or sufficiently aligned within an acceptable tolerance). In some embodiments, for example, the self-alignment of the channel portion 112 is caused by aligning the channel portion 112 to the first gate portion 110, so there is little or no misalignment (i.e., within an acceptable tolerance) between the corresponding edges thereof. Accordingly, there is no (or almost no) overlap between the first gate portion 110 and the drift region 104 (at the right edge of the first gate portion 110) and between the first gate portion 110 and the source region 101 (at the left edge of the first gate portion 110). In other embodiments, various overlaps at the edges of the body region 103 by the first gate portion 110 of the stepped gate 105 are allowable depending on gate charge Qg requirements.

A channel region is formed in the channel portion 112 of the body region 103 upon generation of an electric field by the first gate portion 110 of the stepped gate 105 when a drive signal (e.g., a drive voltage) is applied to the stepped gate 105 to turn the LDMOS device 100 on during operation of the LDMOS device 100, thereby connecting the source region 101 to the drift region 104 and, thus, to the drain region 102. Since the channel portion 112 and the first gate portion 110 are aligned in some embodiments, minimizing the length of the channel region in the channel portion 112 allows for reducing the length Lgthin (129) of the first gate portion 110, thereby reducing the gate charge Qg and the specific resistance Rsp. In some embodiments, the reduction in the length Lgthin (129) is limited only by the lithographic processes used to form the first gate portion 110, the channel portion 112, and/or the first gate insulator region 113.

Additionally, the application of the drive signal to the stepped gate 105 causes the second gate portion 111 thereof to act as a field plate that helps shape the electric field and the currents in the drift region 104, so that the electric field from the second gate portion 111 generates an accumulation region within the portion of the drift region 104 that is adjacent to or near the body region 103. The accumulation region enhances the electrical connection between the channel portion 112 of the body region 103 and the drift region 104, which improves current flow therethrough and improves (or lowers) the specific resistance Rsp of the LDMOS device 100 when activated by the drive signal.

In some embodiments, since the channel portion 112 is aligned with the first gate portion 110 so that there is little or no overlap of the drift region 104 by the first gate portion 110, there is no (or almost no) accumulation region associated with the first gate portion 110. The accumulation region in the drift region 104 is, thus, entirely (or almost entirely) generated due to the effect of the electric field from the second gate portion 111. The reduction, minimization, or elimination of any accumulation region under the first gate portion 110 also helps to reduce or minimize the gate charge Qg and may have only a minimal impact on increasing the specific resistance Rsp slightly. However, as noted above, various overlaps at the edges of the body region 103 by the first gate portion 110 of the stepped gate 105 are possible depending on gate charge Qg requirements of the overall design. Considerable design flexibility with respect to the accumulation region is possible due to the structure of the LDMOS device 100.

In some embodiments, since the first gate portion 110 does not contribute significantly to the accumulation region in the drift region 104, the accumulation region in the drift region 104 is generally controlled or determined by, or depends on, the thickness (128) of the second gate insulator region 114 (in general, a smaller or larger thickness 128 results in a larger or smaller, respectively, accumulation region), the length Lgthick (130) of the second gate portion 111, and the voltage applied to the second gate portion 111. For example, extending the length Lgthick (130) of the second gate portion 111 further into the region over the drift region 104 generally increases the accumulation region, thereby improving the specific resistance Rsp, but only moderately increasing the gate charge Qg. Additionally, selection of the voltage level for the drive signal to be applied to the first gate portion 110 (e.g., to properly generate the channel region in the channel portion 112 of the body region 103) is generally controlled or determined by, or depends on, the thickness (127) of the first gate insulator region 113 (e.g., to help meet a low gate charge Qg design requirement). Since this drive signal voltage level is also applied to the second gate portion 111, the drive signal voltage level generally controls or determines the selection of the thickness (128) of the second gate insulator region 114, so that a sufficient accumulation region can be generated in the drift region 104 to appropriately impact and lower the specific resistance Rsp (e.g., to help meet a low specific resistance Rsp design requirement). Thus, the second gate portion length Lgthick (130) and the second gate insulator thickness (128) are significant parameters (in addition to the first gate portion length Lgthin (129)) for controlling the specific resistance Rsp.

There are typically tradeoffs between the gate charge Qg, the specific resistance Rsp, the breakdown voltage BVdss, and the safe operating area SOA for an LDMOS device. However, the gate shield 106 mitigates or reduces some of the relationships between these parameters. The gate shield 106 is generally a conductive plate disposed over the drift region 104 (or the portion of the drift region 104 not covered by the second gate portion 111). The gate shield 106 generally enables the gate charge Qg to be lower for a given design of the LDMOS device 100. The gate shield 106 also generally enables improvement to the breakdown voltage BVdss (i.e., the breakdown drain-source voltage with the gate grounded or shorted to the source) without introducing additional gate charge Qg.

Without the gate shield 106, for example, a typical LDMOS device would need to have a thicker thick gate insulator region (e.g., similar to the second gate insulator region 114) in order to improve the breakdown voltage BVdss. In that case, however, the LDMOS device would also need to have a longer thick gate portion (e.g., similar to the second gate portion 111) that extends much closer to the drain region or to a point where it can overlap an STI (shallow trench isolation) region. As a consequence of such a design with the thicker thick gate insulator region and the longer thick gate portion, however, the gate charge Qg of the LDMOS device would increase substantially.

With the gate shield 106, on the other hand, the thickness (128) of the second gate insulator region 114, and the length Lgthick (130) by which the second gate portion 111 overlaps the drift region 104, can both be much smaller, since the intervening presence of the gate shield 106 generally decouples these parameters from, or lessens the effect of these parameters on, the breakdown voltage BVdss. In other words, the breakdown voltage BVdss can be independently improved, tuned or optimized by changing the first shield portion length (132) or changing the shield insulator region thickness (131), without significantly adversely affecting the gate charge Qg and/or the specific resistance Rsp. With the gate shield 106, therefore, the gate charge Qg and the specific resistance Rsp can primarily be determined or optimized by selecting the first gate portion length Lgthin (129), the second gate portion length Lgthick (130), the first gate insulator thickness (127), and the second gate insulator thickness (128), without significant concern for adverse effects on the breakdown voltage BVdss and/or the safe operating area SOA.

Additionally, the gate charge is directly related to, or affected by, the gate-drain capacitance (Cgd), among other factors. The Cgd is generally the sum of three primary components, including a first gate-drain capacitance component (Cgd1) 133, a second gate-drain capacitance component (Cgd2) 134, and a third gate-drain capacitance component (Cgd3) 135, represented by dashed-line capacitors overlaying the LDMOS device 100. The Cgd1 133 is from the first gate portion 110 to the drift region 104. Since the body region 103 is aligned under the first gate portion 110, in some embodiments, the Cgd1 133 has a diagonal component, but no purely vertical component, thereby minimizing the Cgd1 133. The Cgd2 is from the second gate portion 111 to the drift region 104. The Cgd2 134 has mostly a vertical component, but the greater thickness (128) of the second gate insulator region 114 (relative to the thickness (127) of the first gate insulator region 113) reduces the Cgd2. The Cgd3 is from the stepped gate 105 (or the second gate portion 111 thereof) to the drain contact 121 and the drain metal region 120. The Cgd3 135, however, is almost eliminated (or almost zero farads) due to the gate shield 106. The use of the gate shield 106, therefore, results in a significant reduction in the total Cgd, and thus of the gate charge Qg.

In other words, the length dimensions 129, 130 and 132 (of the gate portions 110 and 111 and the first shield portion 123) and the thickness dimensions 127, 128 and 131 (of the corresponding insulator regions 113, 114 and 122) enable relatively independent tailoring or tuning of the gate charge Qg, the specific resistance Rsp, the Rsp*Qg product FOM, the breakdown voltage BVdss, the safe operating area SOA, and the reliability of the LDMOS device 100, depending on design requirements for these parameters; thereby improving performance and efficiency of the LDMOS device 100. In various embodiments, the specific resistance Rsp that can be achieved with the improved design of the LDMOS device 100 is about 5.64 mOhm*mm$^2$, or about 5-6 mOhm*mm$^2$, or about 5-7 mOhm*mm$^2$, or about 5-8 mOhm*mm$^2$, or about 6-8 mOhm*mm$^2$, or about 7-8 mOhm*mm$^2$, or within any appropriate range having a lower limit of about 5-7 mOhm*mm$^2$ and an upper limit of about 6-8 mOhm*mm$^2$. In various embodiments, the gate charge Qg that can be achieved with the improved design of the LDMOS device 100 is about 1.954 nC/mm$^2$, or about 1.9-2.0 nC/mm$^2$, or about 1.8-2.7 nC/mm$^2$, or about 1.77-2.66 nC/mm$^2$, or about 1.5-3.0 nC/mm$^2$, or within any appropriate range having a lower limit of about 1.5-2.0 nC/mm$^2$ and an upper limit of about 1.7-3.0 nC/mm$^2$. In various embodiments, the Rsp*Qg product FOM that can be achieved with the improved design of the LDMOS device 100 is about 11 mOhm*nC, or about 10-12 mOhm*nC, or about 10-14 mOhm*nC, or about 10-15 mOhm*nC, or about 11-14.1 mOhm*nC, or about 11-15 mOhm*nC, or within any appropriate range having a lower limit of about 10-14 mOhm*nC and an upper limit of about 11-15 mOhm*nC.

According to some embodiments, the improved LDMOS device 100 is characterized by having relatively small parameter values for the specific resistance Rsp, gate charge Qg, and/or Rsp*Qg product FOM, as disclosed herein. Some prior art LDMOS devices have been purported to have a range of values for one or more of these parameters that may specify an upper limit, but that do not specify a lower limit, thereby appearing to encompass the relatively low parameter values disclosed as achievable by the improved LDMOS device 100. However, since the lower limit for these parameter values for a prior art LDMOS device cannot realistically be unbounded or zero, the actual values cannot be assumed to encompass the presently disclosed specific values or ranges of values without a structural disclosure that enables such values.

Additionally, according to some embodiments, the LDMOS device 100 is characterized by having relatively small dimension values for the first and/or second gate portion length Lgthin and Lgthick dimensions 129 and/or 130 and relatively small dimension values for the first and/or second gate insulator thickness dimensions 127 and/or 128, along with relatively small parameter values for the specific resistance Rsp, gate charge Qg, and/or Rsp*Qg product FOM, as disclosed herein. Some prior art LDMOS devices have been purported to have a range of dimension values for a stepped gate and gate insulators that are similar to or overlap the dimension values disclosed herein for the improved LDMOS device 100, but without disclosing the Rsp, Qg, or Rsp*Qg product FOM parameter values for these prior art LDMOS devices. However, the mere fact that a prior art LDMOS device may have similar dimension values is not an indication that the prior art LDMOS device necessarily can achieve similar parameter values without a structural disclosure that enables such parameter values. Thus, the above described dimension values for the improved LDMOS device 100 are critical for some embodiments and are sufficient to establish a distinction over prior art devices, since prior art devices that have similar dimension values do not necessarily achieve similar operating characteristics, nor are such prior art devices necessarily even operable within an overall electronic circuit having specific high-performance operating requirements.

Additionally, according to some embodiments, the LDMOS device 100 is characterized by having the disclosed architecture with the stepped gate 105 in combination with the gate shield 106. The addition of the gate shield 106, in some embodiments, enabled the unexpected result of the considerably lower Rsp, Qg, and/or Rsp*Qg product FOM parameter values achievable by these embodiments, which thus further enabled incorporation of the LDMOS device 100 in an overall electronic circuit having specific higher-performance operating requirements. These structural features, thus, enable functional aspects that are not taught by conventional LDMOS devices.

Figure 2:
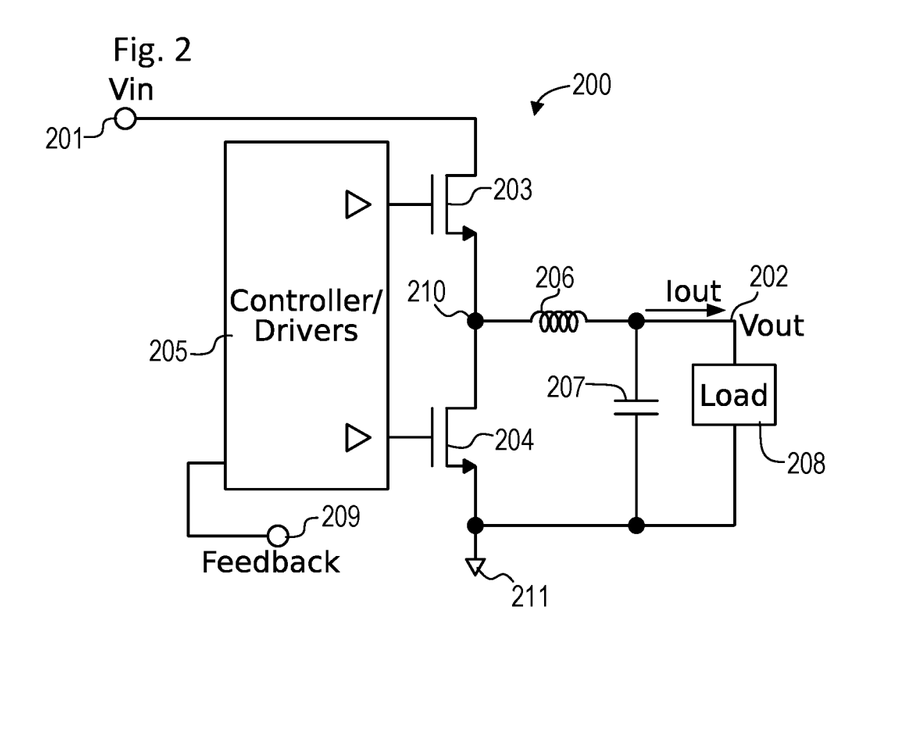
FIG. 2 is a simplified schematic diagram of an example power converter circuit incorporating the LDMOS device shown in FIG. 1, in accordance with some embodiments.

FIG. 2 shows a simplified schematic diagram of an example power converter circuit 200 incorporating the LDMOS device 100 shown in FIG. 1, in accordance with some embodiments. The power converter circuit 200 is an example of a switching converter. Such converters utilize the rapid switching of switches to transfer power in a controlled manner from a power source electrically connected to their input to a load electrically connected to their output. These power converters are often referred to as switching regulators or switched mode regulators. The power converter circuit 200 is an example of a switching regulator in the form of a buck converter. Thus, the power converter circuit 200 generally includes an input node 201, an output node 202, switching elements (e.g., a control FET 203 and a synchronous FET 204), controller and driver circuitry 205, an output inductor 206, and an output capacitor 207, among other components not shown for simplicity. The LDMOS device 100 can be incorporated as the control FET 203 and/or the synchronous FET 204. Although the power converter circuit 200 is depicted as a buck converter, it is understood that the LDMOS device 100 can also be used as a relatively high-speed switching element in other appropriate types of power converter circuits and in other appropriate types of electronic circuits, such as radio frequency (RF) circuits and drivers for light detection and ranging (LIDAR) circuits, among others.

In the illustrated embodiment, an input voltage Vin is applied to the input node 201. The power converter circuit 200 generally converts the input voltage Vin to a regulated output voltage Vout with an output current Iout at the output node 202. A load 208, representing any appropriate electronic circuit, is electrically connected to the output node 202 to receive and be powered by the output voltage Vout and the output current Iout. Electrical power is thus generated and provided to the load 208.

A feedback node 209 electrically connects to the controller and driver circuitry 205 to provide a feedback signal to the controller and driver circuitry 205. The feedback signal is indicative of the level of the load or the voltage, current or power level of the output voltage Vout or output current Iout. The power converter circuit 200 generally regulates or maintains the voltage level of the output voltage Vout based at least on the feedback signal received at the feedback node 209, such that the current level of the output current Iout is sufficient to power the load 208.

The control FET 203 is electrically connected between the input node 201 and a phase node 210. The synchronous FET 204 is electrically connected between the phase node 210 and a reference voltage or ground 211. The output inductor 206 is electrically connected between the phase node 210 and the output node 202. The output capacitor 207 is electrically connected between the output node 202 and ground 211 (or another voltage bias node).

The controller and driver circuitry 205 generally provides drive voltage signals to control nodes (e.g., gate nodes) of the control FET 203 and the synchronous FET 204 (to drive the stepped gate 105) in response to at least the feedback signal received at the feedback node 209. The drive voltage signals turn the control FET 203 and the synchronous FET 204 on and off in a generally alternating manner; such that when the control FET 203 is on, the synchronous FET 204 is off; and when the synchronous FET 204 is on, the control FET 203 is off. When the control FET 203 is on (and the synchronous FET 204 is off), the input voltage Vin is applied to the phase node 210, thereby charging the output inductor 206 and the output capacitor 207 and providing electrical power therethrough to the load 208. When the synchronous FET 204 is on (and the control FET 203 is off), the ground 211 is applied to the phase node 210, such that electrical power is provided to the load 208 from energy stored in the output inductor 206 and the output capacitor 207. In this manner, electrical power at the phase node 210 is provided to the load 208 through an output filter comprising the output inductor 206 and the output capacitor 207.

Incorporating the LDMOS device 100 in the power converter circuit 200 enables faster, or higher, on/off switching frequency for the control FET 203 and the synchronous FET 204, but with lower switching power consumption, thereby resulting in better power conversion performance, i.e., greater power conversion efficiency, for the power converter circuit 200 than is possible with conventional switching elements. The higher switching frequency is generally due to the lower Rsp*Qg product FOM achievable with the LDMOS device 100. The higher switching frequency also results in smaller ripples in the output voltage Vout and the output current Iout than is possible with conventional switching elements having the same or similar switching power consumption level and/or used with the same or similar inductance value for the output inductor 206. In other words, the higher switching frequency of the LDMOS device 100 (in combination with the smaller dimension values and the better performance parameter values described above for some embodiments) enable the LDMOS device 100 to be used in applications having design constraints or requirements for a higher switching frequency, but lower power consumption.

In addition to the improved performance of the power converter circuit 200, the higher switching frequency allows for the output inductor 206 to have a smaller size (i.e., lower inductance value) than is typically allowed in conventional power converter circuits. The smaller size for the output inductor 206, therefore, results in a smaller overall size and/or lower cost for the power converter circuit 200, thereby enabling the power converter circuit 200 to be used in applications that have smaller or tighter spatial design constraints or requirements.

In various embodiments, a range for the switching frequency achievable by the improved design of the power converter circuit 200 (due to the improved LDMOS device 100) is about 1-2 MHz, or about 2-8 MHz, or about 1-8 MHz, or within any appropriate range having a lower limit of about 1-7 MHz and an upper limit of about 2-8 MHz.

In various embodiments, the improved LDMOS device 100 can be used in the power converter circuit 200 with operating parameters in which the input voltage Vin is in a range of about 12-24 V, the output voltage Vout is in a range of about 1.2-5 V, the output current Iout is in a range of about 1-50 Amp.

Figure 3:
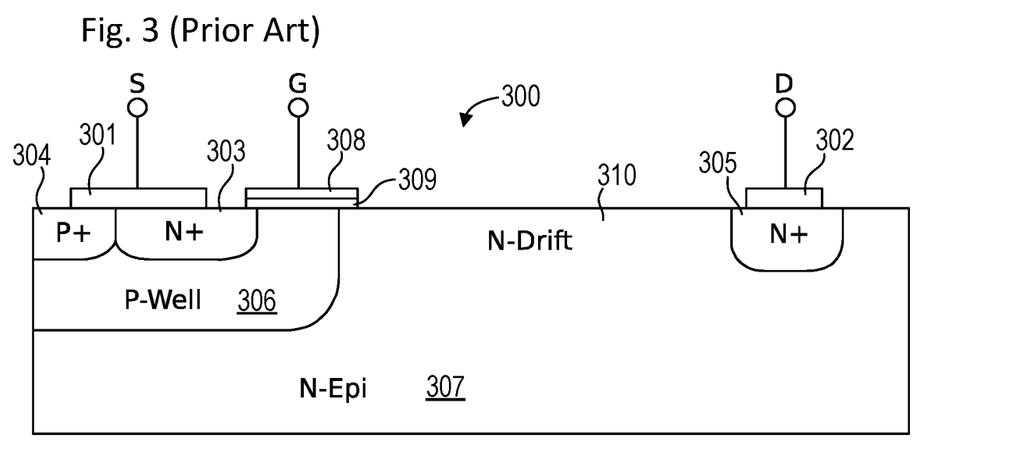
FIGS. 3 and 4 show prior art LDMOS devices.

FIG. 3 shows a basic prior art LDMOS device 300, which includes a source contact 301, a drain contact 302, an N+ source region 303, a P+ source contact region 304, an N+ drain region 305, a P-well region 306, an N-epi region 307, a gate 308, and a gate oxide 309. The P-well region 306 forms a body region, and a channel region is formed in a portion thereof beneath the gate 308. Additionally, the N-epi region 307 includes an N-drift region 310 near the top surface thereof between the P-well region 306 and the N+ drain region 305.

The prior art LDMOS device 300 has several disadvantages in comparison with the LDMOS device 100. For example, high voltages in a junction area between the channel region and the N-drift region 310 generally lead to a relatively low breakdown voltage compared to the breakdown voltage BVdss that can be achieved with the improved design of the LDMOS device 100. In addition, the prior art LDMOS device 300 lacks a gate shield. Therefore, the prior art LDMOS device 300 further lacks the advantages described above for the gate shield 106, such as an ability to tune some device parameters independently of other device parameters. Additionally, the gate 308 is not aligned with the channel region or body region. Therefore, the prior art LDMOS device 300 lacks the advantages of such alignment described above for the LDMOS device 100. Furthermore, the gate 308 overlaps the N-drift region 310. An accumulation region is thus formed within the overlapping portion of the N-drift region 310, but the accumulation region results entirely from the electric field due to the overlapping portion of the gate 308. Compared to the LDMOS device 100, therefore, very little design flexibility for the accumulation region is possible. Additionally, overlap of the gate 308 and the N-drift region 310 negatively affects the gate charge Qg. Consequently, the prior art LDMOS device 300 is not capable of the relatively low specific resistance Rsp, gate charge Qg, and Rsp*Qg product FOM, regardless of the length of the gate 308 or the thickness of the gate oxide 309, and is thus unsuitable for use in higher frequency applications.

Figure 4:
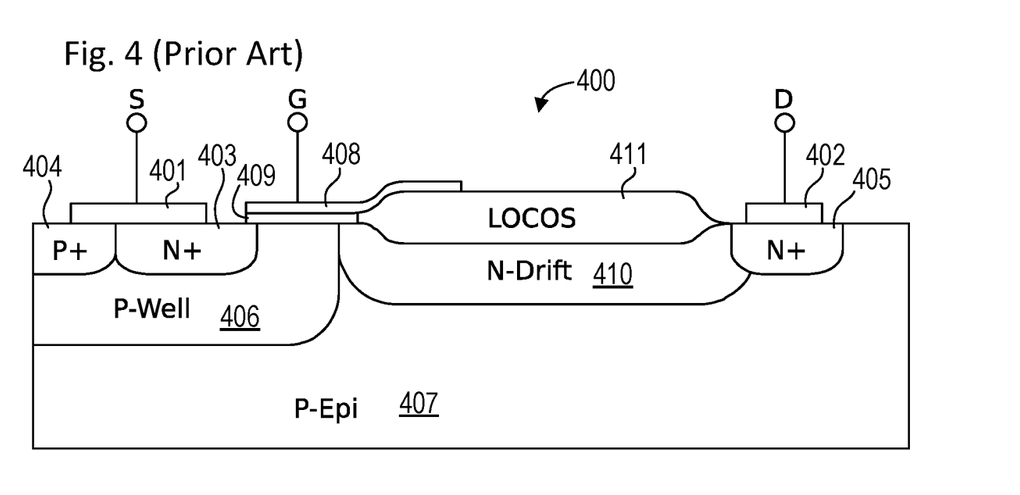

FIG. 4 shows another prior art LDMOS device 400, which includes a source contact 401, a drain contact 402, an N+ source region 403, a P+ source contact region 404, an N+ drain region 405, a P-well region 406, a P-epi region 407, a gate 408, a gate oxide 409, an N-drift region 410, and a local oxidation of silicon (LOCOS) isolation region 411. The P-well region 406 forms a body region, and a channel region is formed in a portion thereof beneath the gate 408. The N-drift region 410 is implanted in the P-epi region 407, and the LOCOS isolation region 411 is formed thereon. A portion of the gate 408 extends as a field plate over the LOCOS isolation region 411. Unlike the improved LDMOS device 100, therefore, the prior art LDMOS device 400 employs a RESURF (REduced SURface Field) technique that allows the doping of the N-drift region 410 to be increased and the length of the N-drift region 410 to be shortened, thereby reducing the specific resistance Rsp of the prior art LDMOS device 400 compared to the prior art LDMOS device 300. The additions of the RESURF and the field plate also improve the specific resistance Rsp and breakdown voltage BVdss trade off compared to that of the prior art LDMOS device 300.

The prior art LDMOS device 400 has several disadvantages in comparison with the LDMOS device 100. For example, the prior art LDMOS device 400 lacks a gate shield. Therefore, the prior art LDMOS device 400 further lacks the advantages described above for the gate shield 106, such as an ability to tune some device parameters independently of other device parameters. Additionally, an active portion of the gate 408 (over the channel region) is not aligned with the channel region or body region. Therefore, the prior art LDMOS device 400 lacks the advantages of such alignment described above for the LDMOS device 100. Instead, the active portion of the gate 408 overlaps the N-drift region 410, thereby resulting in an accumulation region due to the electric field from the active portion of the gate 408; whereas any accumulation region due to the first gate portion 110 of the stepped gate 105 of the improved LDMOS device 100 is almost nonexistent. The design of the prior art LDMOS device 400, therefore, does not allow for the flexibility in controlling the accumulation region that is enabled by the design of the improved LDMOS device 100 as described above. Additionally, overlap of the gate 408 and the N-drift region 410 negatively affects the gate charge Qg. Consequently, the prior art LDMOS device 400 is not capable of the relatively low specific resistance Rsp, gate charge Qg, and Rsp*Qg product FOM, regardless of the length of the gate 408 or the thickness of the gate oxide 409, and is thus unsuitable for use in higher frequency applications.

Figure 5:
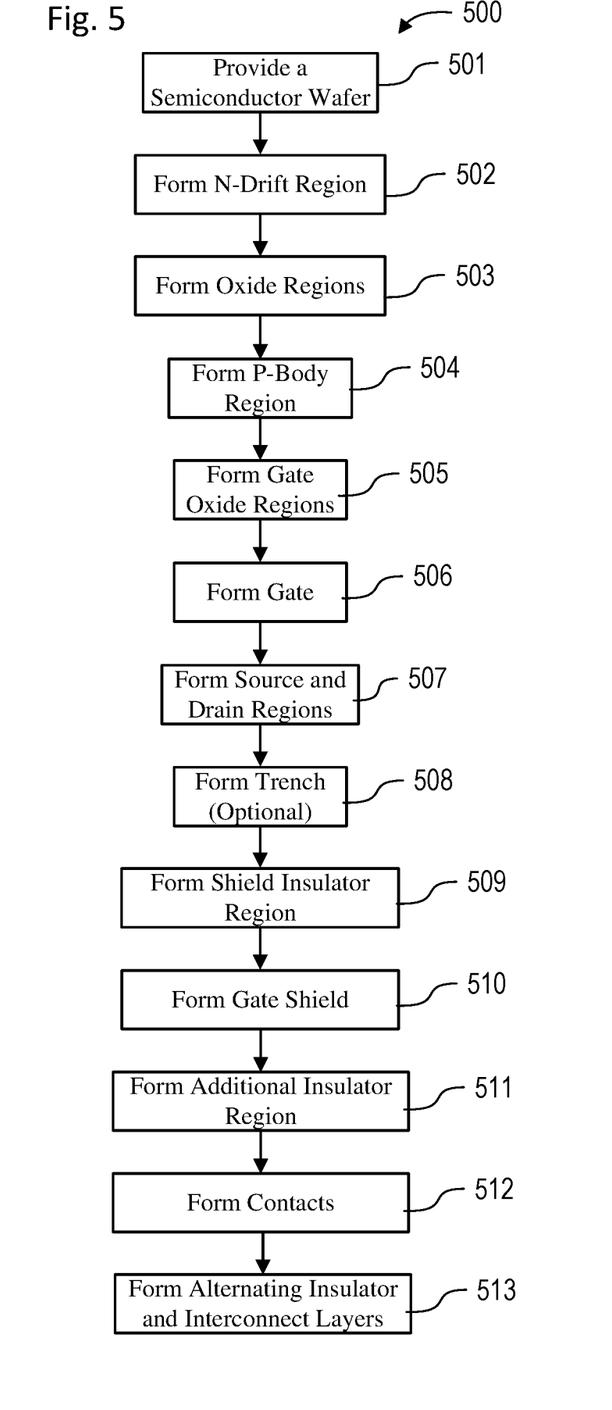
FIG. 5 is a simplified flowchart for an example process of fabricating the LDMOS device shown in FIG. 1, in accordance with some embodiments.

FIG. 5 shows a simplified flowchart for an example process 500 of fabricating the LDMOS device 100 shown in FIG. 1, in accordance with some embodiments. The particular steps, combination of steps, and order of the steps are provided for illustrative purposes only. Other processes with different steps, combinations of steps, or orders of steps can also be used to achieve the same or similar result. Features or functions described for one of the steps may be performed in a different step in some embodiments. Furthermore, additional steps not explicitly shown or described may be performed before or after or as a sub-portion of the steps shown.

Upon starting, a semiconductor wafer is provided (at 501). In some embodiments, the semiconductor wafer is already a fully formed SOI wafer at this point. In some embodiments, the semiconductor wafer is a bulk semiconductor wafer, i.e., without a buried oxide of an SOI wafer. In some embodiments, providing the semiconductor wafer at 501 includes forming a buried oxide layer (e.g., for the buried insulator layer 108 in FIG. 1) on a substrate (e.g., the substrate layer 109 in FIG. 1) and forming a semiconductor layer of the active region 107 (e.g., an intrinsic layer, N-minus layer, or P-minus layer into and onto which the above described active layer is to be formed) on the buried oxide layer (e.g., by epitaxial growth or layer transfer techniques), thereby forming an SOI wafer.

Some of the subsequent structure formation steps are performed, for example, by patterning a photoresist over the semiconductor layer and implanting dopants of the appropriate N and P conductivity to form the active region 107 of the LDMOS device 100. Additionally, these formation steps can be performed in conjunction with forming other structures or components (e.g., of MOSFETs) of the overall electronic circuit or integrated circuit (e.g., including the power converter circuit 200) of which the resulting LDMOS device 100 is a part.

At 502, to begin forming the active region 107, the drift region 104 (such as an N-drift region) is formed, e.g., by epitaxial growth of an N-type material or implantation of an N-type dopant in the semiconductor layer of the active region 107.

At 503, regions of oxide or insulator materials are formed on the active region 107. Additionally, areas of the oxide are removed from portions of locations where the source region 101, the drain region 102, and/or the body region 103 (or the connector regions associated therewith) will be, so that subsequent processing steps can implant or deposit dopants or materials through these openings in the oxide.

At 504, the body region 103 is formed, e.g., by implantation of a P-type dopant into the semiconductor layer of the active region 107.

At 505, gate oxide regions (e.g., the gate insulator regions 113 and 114) are formed, e.g., by deposition of an appropriate oxide or insulator material.

At 506, the stepped gate 105 is formed, e.g., by deposition of an appropriate polysilicon material onto the gate insulator regions 113 and 114.

At 507, the source region 101 and the drain region 102 are formed, e.g., by implantation of an appropriate N-type dopant to form N+ regions.

At 508, the optional trench 119 is formed, if it is part of the design.

At 509, the shield insulator region 122 is formed, e.g., by deposition of an appropriate oxide or insulator material over the drift region 104 and the stepped gate 105.

At 510, the gate shield 106 (and optionally portions of the source contact 117, the body contact 118, and the drain contact 121) is formed, e.g., by deposition of an appropriate electrical conductor material, such as a metal material.

At 511, the additional insulator region (e.g., an oxide) 125 is formed, e.g., by deposition of an appropriate oxide or insulator material on the gate shield 106.

At 512, the contacts (e.g., the source contact 117, the body contact 118, the drain contact 121, and a gate contact outside the plane of FIG. 1) are formed, e.g., by deposition of an appropriate electrical conductor material, such as a metal material, into openings in the oxides or insulator materials.

At 513, a series of alternating insulator layers (with electrically conductive vias therethrough) and electrically conductive interconnect layers (e.g., metal layers) are formed, thereby electrically connecting the LDMOS device 100 through the contacts 117, 118 and 121 to the other structures or components of the overall electronic circuit or integrated circuit (e.g., including the power converter circuit 200) of which the resulting LDMOS device 100 is a part.

The overall electronic circuit or integrated circuit is further processed into an integrated circuit package.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A laterally diffused MOSFET device comprising:
   a source region;
   a drain region;
   a body region between the source region and the drain region;
   a drift region between the body region and the drain region;
   a stepped gate having a first portion disposed over the body region and a second portion disposed over a first portion of the drift region, the first and second portions of the stepped gate being continuous with each other;
   a first gate insulator region between the first portion of the stepped gate and the body region, the first gate insulator region having a first thickness;
   a second gate insulator region between the second portion of the stepped gate and the first portion of the drift region, the second gate insulator region having a second thickness greater than the first thickness; and
   a gate shield, a first portion of which is disposed over a second portion of the drift region between the stepped gate and the drain region to reduce a gate-drain capacitance of the laterally diffused MOSFET device;
   wherein:
   the laterally diffused MOSFET device has a specific resistance (Rsp) of about 5-8 mOhm*mm$^2$, a gate charge (Qg) of about 1.9-2.0 nC/mm$^2$, and an Rsp*Qg product figure of merit of about 10-15 mOhm*nC.

2. The laterally diffused MOSFET device of claim 1, wherein:

the first portion of the stepped gate has a first length of about 0.1-0.4 µm;

the second portion of the stepped gate has a second length of about 0.1-0.6 µm;

the first gate insulator region has a first thickness of about 30-62 Å; and the second gate insulator region has a second thickness of about 300-500 Å.

3. The laterally diffused MOSFET device of claim 2, further comprising:

a shield insulator region between the first portion of the gate shield and the second portion of the drift region, the shield insulator region having a thickness of about 900-1100 Å;

wherein the gate shield laterally extends about 0.3-0.7 µm from above an edge of the stepped gate in a direction toward the drain region.

4. The laterally diffused MOSFET device of claim 3, wherein:

the laterally diffused MOSFET device is configured to form a channel region within the body region having a length that is about the same as the first length of the first portion of the stepped gate; and the laterally diffused MOSFET device is configured to form an accumulation region within the first portion of the drift region due to an electric field from the second portion of the stepped gate.

5. The laterally diffused MOSFET device of claim 4, wherein:

the channel region is aligned with the first portion of the stepped gate.

6. The laterally diffused MOSFET device of claim 1, further comprising:

a source contact electrically connected to the source region and to the gate shield.

7. The laterally diffused MOSFET device of claim 1, wherein:

a second portion of the gate shield is disposed over the stepped gate.

8. An electronic circuit comprising the laterally diffused MOSFET device of claim 1, the electronic circuit further comprising:

a switching element electrically connected to a phase node, the switching element comprising the laterally diffused MOSFET device;

a controller electrically connected to the laterally diffused MOSFET device to provide a drive signal to the stepped gate;

an inductor electrically connected to the phase node and an output node; and a load electrically connected to receive an output voltage at the output node.

9. The electronic circuit of claim 8, wherein:

the drive signal is provided to the stepped gate with a switching frequency of about 1-8 MHz.

10. A laterally diffused MOSFET device comprising:

a source region;

a drain region;

a body region between the source region and the drain region;

a drift region between the body region and the drain region;

a stepped gate having a first portion and a second portion adjacent to and continuous with each other;

a first gate insulator region between the first portion of the stepped gate and the body region; and a second gate insulator region between the second portion of the stepped gate and at least a first portion of the drift region;

wherein:

the laterally diffused MOSFET device has a specific resistance (Rsp) of about 5-8 mOhm*mm$^2$, a gate charge (Qg) of about 1.9-2.0 nC/mm$^2$, and an Rsp*Qg product figure of merit of about 10-15 mOhm*nC.

11. The laterally diffused MOSFET device of claim 10, further comprising:

a gate shield, a first portion of the gate shield being disposed over a second portion of the drift region between the stepped gate and the drain region, and a second portion of the gate shield being disposed over the stepped gate, the gate shield being configured to reduce a gate-drain capacitance of the laterally diffused MOSFET device.

12. The laterally diffused MOSFET device of claim 11, wherein:

the gate shield extends from above an edge of the stepped gate toward the drain region and over the second portion of the drift region by a length of about 0.3-0.7 µm.

13. The laterally diffused MOSFET device of claim 10, wherein:

the first portion of the stepped gate has a first length of about 0.1-0.4 µm;

the second portion of the stepped gate has a second length of about 0.1-0.6 µm;

the first gate insulator region has a first thickness of about 30-62 Å; and the second gate insulator region has a second thickness of about 300-500 Å.

14. An electronic circuit comprising the laterally diffused MOSFET device of claim 10, the electronic circuit further comprising:

a switching element electrically connected to a phase node, the switching element comprising the laterally diffused MOSFET device;

a controller electrically connected to the laterally diffused MOSFET device to provide a drive signal to the stepped gate;

an inductor electrically connected to the phase node and an output node; and a load electrically connected to receive an output voltage at the output node.

15. The electronic circuit of claim 14, wherein:

the drive signal is provided to the stepped gate with a switching frequency of about 1-8 MHz.

16. The laterally diffused MOSFET device of claim 10, further comprising:

a first gate-drain capacitance between the first portion of the stepped gate and the drift region;

a second gate-drain capacitance between the second portion of the stepped gate and the drift region; and a third gate-drain capacitance between the stepped gate and a drain contact that is almost zero.

17. The laterally diffused MOSFET device of claim 10, further comprising:

a channel region being aligned with, and having about a same length as, the first portion of the stepped gate; and an accumulation region within the first portion of the drift region due to an electric field from the second portion of the stepped gate.

18. The laterally diffused MOSFET device of claim 10, wherein:

the drift region and the body region are formed above a buried insulator layer of an SOI wafer.

\* \* \* \* \*